United States Patent [19]

Yamamoto

[11] Patent Number: 5,481,082
[45] Date of Patent: Jan. 2, 1996

[54] APPARATUS AND METHOD FOR DIE BONDING SEMICONDUCTOR ELEMENT

[75] Inventor: Yousuke Yamamoto, Itami, Japan

[73] Assignee: Mitsubishi Denki Kabushiki Kaisha, Tokyo, Japan

[21] Appl. No.: 231,469

[22] Filed: Apr. 22, 1994

[30] Foreign Application Priority Data

Jul. 19, 1993 [JP] Japan .................... 5-177777

[51] Int. Cl.⁶ ..................................... B23K 26/02
[52] U.S. Cl. ................. 219/121.63; 219/121.64
[58] Field of Search ............. 219/121.6, 121.63, 219/121.64, 121.85

[56] References Cited

U.S. PATENT DOCUMENTS

| | | | |
|---|---|---|---|
| 4,404,453 | 9/1983 | Gotman | 219/121 LD |
| 4,424,435 | 1/1984 | Barnes, Jr. | 219/121 LD |
| 4,733,039 | 3/1988 | Schnable et al. | 219/121 LD |
| 5,010,036 | 4/1991 | Calviello et al. | 437/173 |
| 5,122,635 | 6/1992 | Knodler et al. | 219/121.63 |
| 5,357,122 | 10/1994 | Okubora et al. | 257/84 |

FOREIGN PATENT DOCUMENTS

| | | | |
|---|---|---|---|
| 2849716 | 11/1978 | Germany . | |
| 207067 | 2/1984 | Germany | 219/121.64 |
| 61-16689 | 5/1986 | Japan . | |
| 62-30394 | 2/1987 | Japan . | |
| 2197373 | 8/1990 | Japan . | |
| 2-197373 | 8/1990 | Japan | 219/121.85 |
| 2280961 | 11/1990 | Japan . | |
| 3-180289 | 8/1991 | Japan | 219/121.64 |
| 4103142 | 4/1992 | Japan . | |
| 2244374 | 5/1990 | United Kingdom . | |

OTHER PUBLICATIONS

R. L. Melcher, "Laser-Welded Package for Semiconductor and Superconductor Electronics", IBM Technical Disclosure Bulletin, vol. 22, No. 2, Jul. 1979, p. 834.
Zum Titelbild, "Mehrfachlöten mit dem Laserstrahl", vol. 47, No. 21, 1975 München, p. 6.

Primary Examiner—Teresa J. Walberg
Assistant Examiner—J. Pelham
Attorney, Agent, or Firm—Leydig, Voit & Mayer

[57] ABSTRACT

An apparatus for die bonding a semiconductor element to a submount with a soldering material includes a laser light source emitting laser light of a wavelength transmitting through the submount and a means for introducing the laser light emitted from the laser light source to a prescribed position and radiating the laser light to a required part of the submount. A method for die bonding a semiconductor element to a submount, includes placing a soldering material on the submount and placing the semiconductor element on the soldering material, radiating laser light of a wavelength transmitting through the submount from the rear surface side of the submount toward the soldering material so as to heat and melt the soldering material, and thereby bonding the semiconductor element to the submount. Thus, the die bonding is performed in a short time while observing the characteristic of the semiconductor element, so that deformation of the element or deterioration of the element characteristic during the die bonding is prevented even when the semiconductor element is subjected to a high temperature for a long time during the die bonding.

5 Claims, 10 Drawing Sheets

APPARATUS AND METHOD FOR DIE BONDING SEMICONDUCTOR ELEMENT

FIELD OF THE INVENTION

The present invention relates to an apparatus and a method for die bonding a semiconductor element to a submount comprising Si or the like with a soldering material which is heated and melted and, more particularly, to heating and melting the soldering material with laser light.

BACKGROUND OF THE INVENTION

Figure 7:
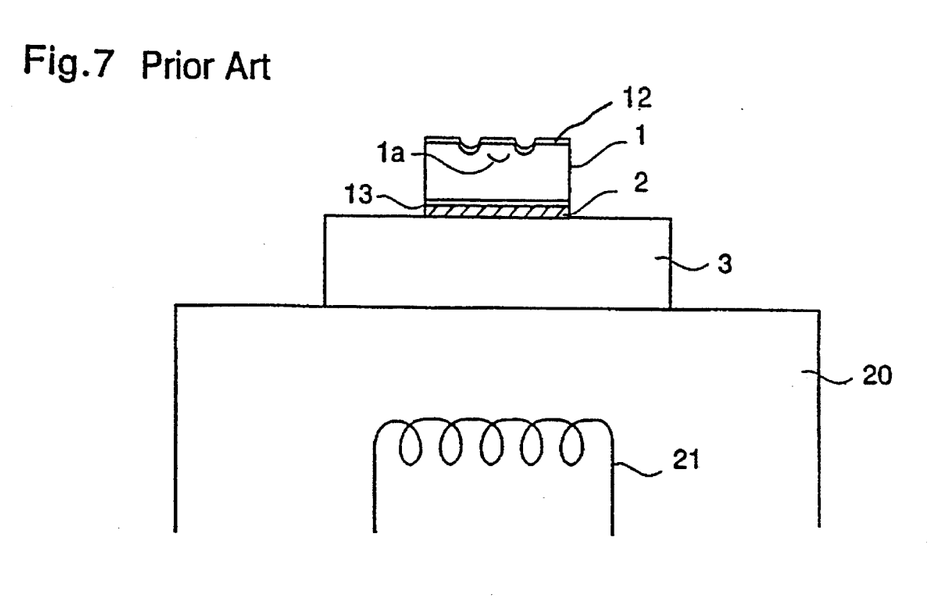
FIG. 7 is a schematic diagram illustrating an apparatus and a method for die bonding a semiconductor element in accordance with the prior art.

FIG. 7 is a schematic view showing a method for die bonding a semiconductor element employing a prior art die bonding apparatus disclosed in Japanese Published Patent Application No. 62-30394. In FIG. 7, reference numeral 1 designates an optical semiconductor element having dimensions of 300 μm×300 μm and a thickness of approximately 100 μm, and including an active layer 1a. An upper surface electrode 12 comprising Au/AuGe/NiAu and having a thickness of 0.3 to 0.5 μm is disposed on the upper surface of the optical semiconductor element 1. A rear surface electrode 13 comprising TiAu and having a thickness of 0.3 to 0.5 μm is disposed on the rear surface of the optical semiconductor element 1. The optical semiconductor element 1 is mounted on a Si submount 3 having a thickness of 300 to 500 μm with a soldering material 2 having a thickness of 0.5 to 1.0 μm and-comprising Au/Sn or Au/Si. The Si submount 3 is disposed on an upper surface of a heat block 20, and the heat block 20 includes a heater 21 for heating the block to a temperature that can melt the soldering material 2.

Figure 8A:
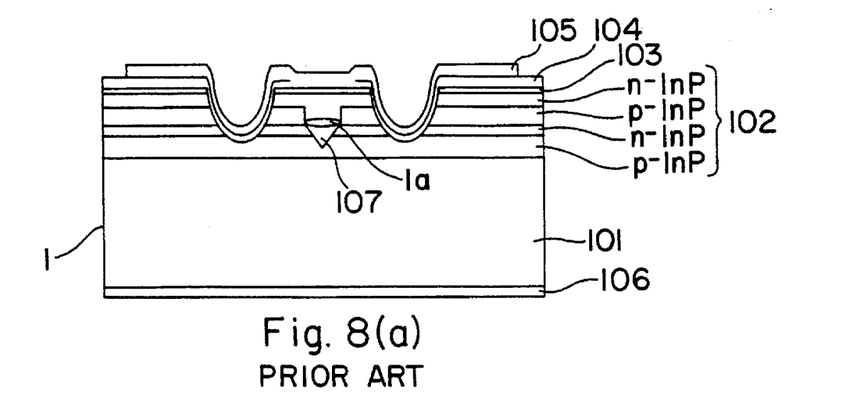
FIGS. 8(a) and 8(b) are diagrams illustrating a cross-sectional structure of a PBC laser as an example of a semiconductor element to be die bonded onto a Si submount, and a plan diagram illustrating the semiconductor element disposed on the Si submount.

FIG. 8(a) is a view illustrating a cross-sectional structure of a PBC laser mentioned in JOURNAL OF LIGHTWAVE TECHNOLOGY, vol. LT-3, No. 5, October 1985 (IEEE), p. 978 as an example of the above-described optical semiconductor element 1. In FIG. 8(a), reference numeral 101 designates a p type InP substrate. A p-n-p-n type current blocking layer 102 comprising four InP layers, an n type InGaAsP layer 103, a $SiO_2$ insulating film 104, and an n type electrode 105 are successively disposed on the p type substrate 101. A p type electrode 106 is disposed on the rear surface of the p type InP substrate 101. Reference numeral 107 designates a p type InP layer in a mesa shape.

Figure 8B:
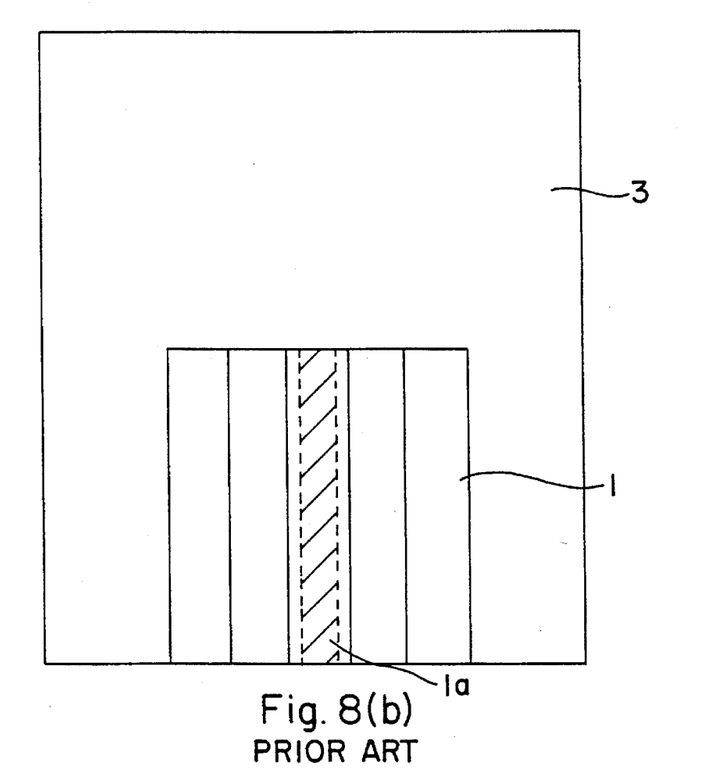

The optical-semiconductor element 1 such as the above-described PBC laser is mounted on the Si submount 3 with soldering material 2, and the soldering material 2 is heated and melted, whereby the optical semiconductor element 1 is bonded to the Si submount 3. A plan view thereof is shown in FIG. 8(b).

The prior art die bonding method will be described.

First of all, the soldering material 2 is placed on the Si submount 3, and the optical semiconductor element 1 is placed on the soldering material 2 while controlling the position of the element 1 by observing the same with, for example, television camera or the like.

Figure 10A:
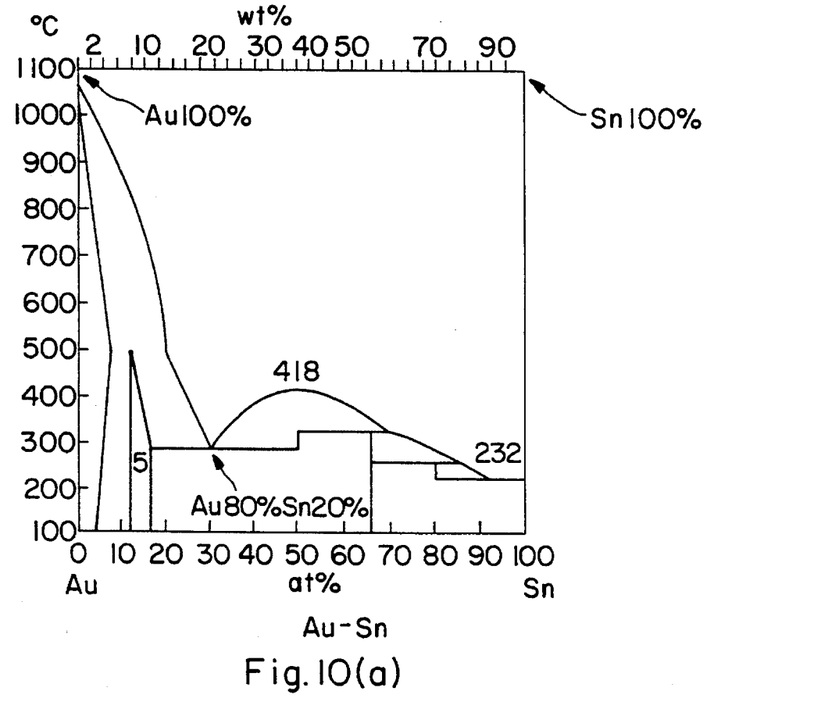
FIGS. 10(a) and 10(b) are phase diagrams showing differences in melting temperature with respect to weight ratio for AuSn and AuSi, respectively.
Figure 10B:
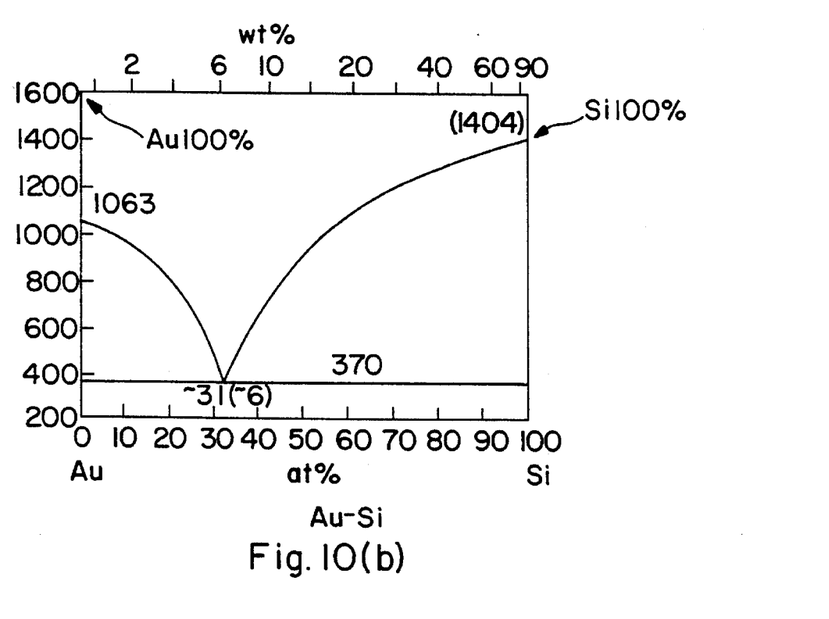

Next, the Si submount 3 on which the optical semiconductor element 1 is mounted with the soldering material 2, is placed on the heat block 20 which is previously heated by the heater 21 up to 200° to 400° C. at which temperature the soldering material 2 is melted, thereby raising the temperature of the soldering material 2 in several or less than ten seconds and melting the soldering material 2. The melting point of the soldering material 2 differs depending on material and weight ratio thereof of the soldering material 2. When Au/Sn is employed as the material, when the weight ratio is Au/Sn=80/20% as shown in FIG. 10(a), the material is melted at approximately 300° C. In a case where Au/Si is employed as the material, when the weight percentage is Au/Si=94/6% as shown in FIG. 10(b), the material is melted at approximately 400° C.

Next, the soldering material 2 is cooled, so that the soldering material 2 is solidified to bond the optical semiconductor element 1 to the Si submount 3.

Figure 9A:
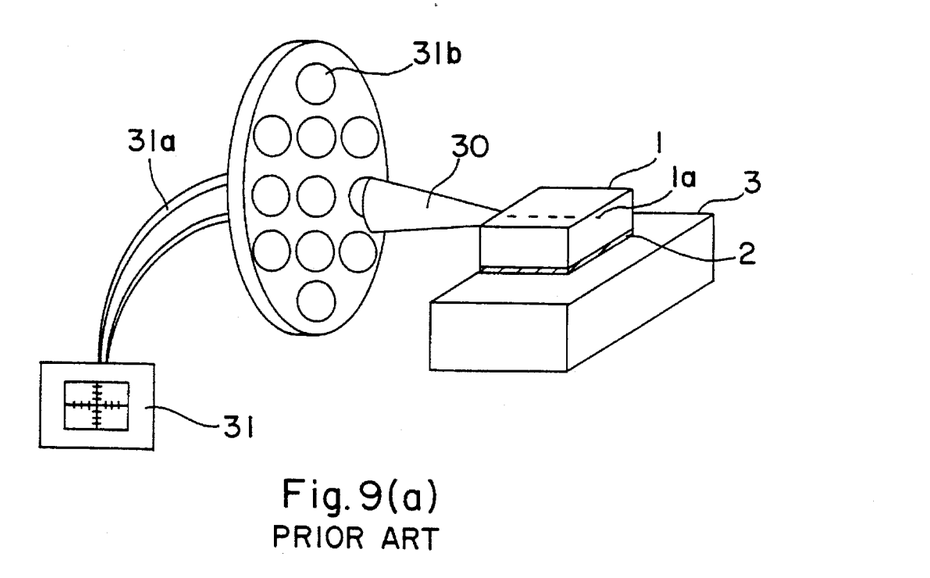
FIGS. 9(a) and 9(b) are diagrams illustrating the prior art method for examining element characteristics.

Finally, as shown in FIG. 9(a), when the optical semiconductor element 1 bonded to the Si submount 3 is driven, the characteristics of the optical semiconductor element 1 are tested by a position detector 31 comprising light receiving elements 31b for receiving the laser light 30 emitted from the active layer 1a and a cable 31a for transmitting the laser light 30 received by the light receiving element 31b.

Figure 9B:
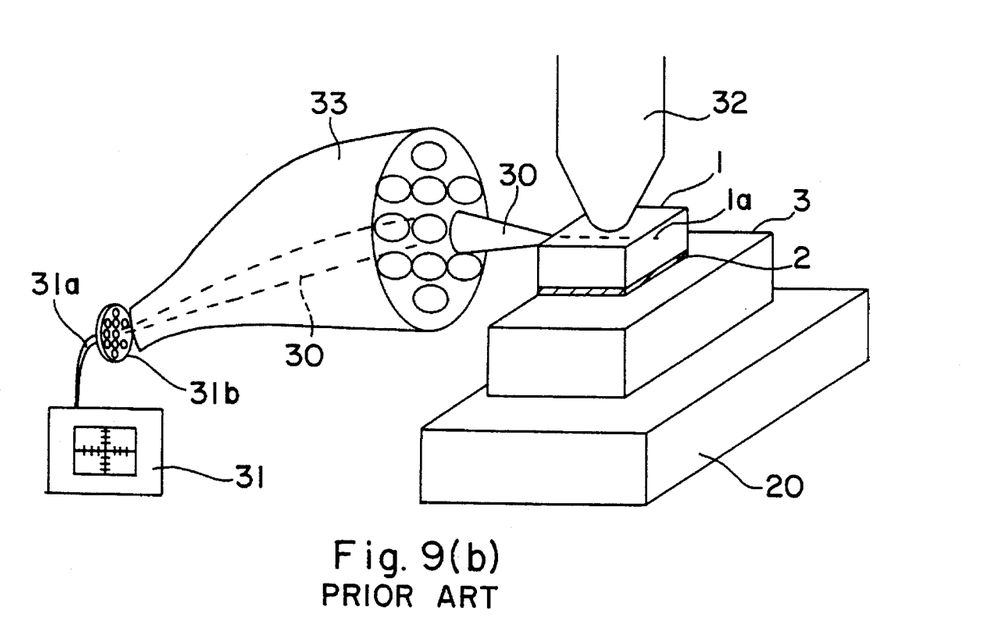

In the prior art apparatus and method for die bonding a semiconductor element as described above, the Si submount 3 on which the optical semiconductor element 1 is mounted with the soldering material 2 is placed on the heat block 20 which is heated previously up to 200° to 400° C., so that the optical semiconductor element 1 is also heated during die bonding, with a result that the optical semiconductor element 1 is deformed or its characteristics are deteriorated, resulting in a problem. In addition, when die bonding is performed while testing the element characteristics with the position detector 31, it is required, as shown in FIG. 9(b) that the light receiving elements 31b be located far from the heat block 20, employing an optical fiber 33 to transmit the laser light 30. Otherwise the light receiving elements 31b are destroyed by the heat so that the apparatus for test becomes unfavorably complicated.

SUMMARY OF THE INVENTION

It is an object of the present invention to provide an apparatus and a method for die bonding a semiconductor element to a submount comprising Si or the like without exposing the semiconductor element to a temperature as high as 200° to 400° C. for a long time, and for die bonding while observing element characteristics.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, an apparatus for-die bonding a semiconductor element to a submount with a soldering material is provided with a laser light source for emitting laser light of a wavelength that travels through the submount, and means for introducing the laser light emitted from the laser light source to a prescribed position and irradiating a prescribed part of the submount with the laser light. Therefore, the laser light travels through the submount and irradiates the soldering material, whereby the soldering material is heated and melted in a short time without heating the submount.

According to a second aspect of the present invention, an apparatus for die bonding a semiconductor element to a submount with a soldering material is provided with a laser light source for emitting laser light of a wavelength that travels through the semiconductor element, and means for introducing the laser light emitted from the laser light source to a prescribed position and irradiating a required part of the semiconductor element with the laser light. Therefore, the laser light travels through the semiconductor element and irradiates a rear surface electrode of the semiconductor element, whereby the soldering material is heated and melted in a short time without heating the submount.

According to a third aspect of the present invention, a method for die bonding a semiconductor element to a submount comprises placing a soldering material on a submount, placing a semiconductor element on the soldering material, irradiating the soldering-material with laser light of a wavelength traveling through the submount from a rear surface side of the submount, heating and melting the soldering material with the laser light traveling through the submount, thereby bonding the semiconductor element to the submount. Therefore, the die bonding is performed in a short time while observing the element characteristics, whereby deformation of the semiconductor element and deterioration of the element characteristics are prevented even when the semiconductor element is subjected to a high temperature for a long time during die bonding, resulting in high precision positioning of the semiconductor element.

According to a fourth aspect of the present invention, a method for die bonding a semiconductor element to a submount comprises forming a metal film on a rear surface of the submount and, thereafter, placing a soldering material on the submount and placing the semiconductor element on the soldering material, irradiating a metal film with laser light of a wavelength traveling through the submount after incidence on the upper surface of the submount in a diagonal direction at a prescribed angle to the submount, heating and melting the soldering material with the laser light traveling through the submount and reflected by the metal film, thereby bonding the semiconductor element to the submount. Therefore, even on a sample plate which transmits no laser light, the die bonding is performed in a short time while observing the element characteristics, whereby deformation of the semiconductor element and deterioration of the element characteristics are prevented even when the semiconductor element is subjected to a high temperature for a long time during the die bonding, resulting in high precision positioning of the semiconductor element.

According to a fifth aspect of the present invention, in the above-described method for die bonding a semiconductor element, a Si submount is employed as the submount, and laser light of a wavelength 1 µm is employed as the laser light.

According to a sixth aspect of the present invention, in the above-described method for die bonding a semiconductor element, a Si submount is employed as the submount, laser light of a wavelength 1 to 1.6 µm is employed as the laser light with which the soldering material is irradiated from the rear side of the Si submount and transmitted therethrough. The method further comprises forming an InGaAs layer having a prescribed area at a prescribed position on the upper surface of the Si submount, placing the soldering material on the InGaAs layer and placing the semiconductor element on the soldering material, whereby laser light having a wavelength of 1 to 1.6 µm traveling through the Si submount is absorbed by the InGaAs layer and the InGaAs layer is heated and melts the soldering material. Therefore, the die bonding is performed in a short time while observing the element characteristics, whereby deformation of the semiconductor element and deterioration of the element characteristics are prevented even when the semiconductor element is subjected to a high temperature for a long time during die bonding, resulting in high precision positioning of the semiconductor element.

According to a seventh aspect of the present invention, in the above-described method for die bonding a semiconductor element, a Si submount is employed as the submount, laser light of a wavelength 1 to 1.6 µm is employed as the laser light which irradiates to the Si submount, on the rear surface of which a metal film is formed, at a prescribed angle and travels through the Si submount. The method further includes forming an InGaAs layer having a prescribed area at a prescribed position on the upper surface of the Si submount, and then placing the soldering material on the InGaAs layer and placing the semiconductor element on the soldering material, and whereby the laser light of a wavelength 1 to 1.6 µm traveling through the Si submount is absorbed by the InGaAs layer, and the InGaAs layer is heated and melts the soldering material. Therefore, the die bonding is performed in a short time while observing the element characteristics, whereby deformation of the semiconductor element and deterioration of the element characteristics are prevented even when the semiconductor element is subjected to a high temperature for a long time during the die bonding, resulting in high precision positioning of the semiconductor element.

According to an eighth aspect of the present invention, in the above-described method for die bonding a semiconductor element, a bar-shaped laser array having a large area and including a plurality of active layers is employed as the semiconductor element, and a submount having an area corresponding to that of the laser array is irradiated with laser light emitted at spatial intervals. Therefore, even when the semiconductor element has a large area, the die bonding is performed in a short time while observing the element characteristics, whereby deformation of the semiconductor element and deterioration of the element characteristics are prevented even when the semiconductor element is subjected to a high temperature for a long time during the die bonding, resulting in high precision positioning of the semiconductor element.

According to a ninth aspect of the present invention, in the above-described method for die bonding a semiconductor element, a bar-shaped laser array having a large area and including a plurality of active layers is employed as the semiconductor element, and the submount having an area corresponding to that of the laser array is irradiated with laser light by scanning the surface of the submount with a movable optical fiber. Therefore, even when the semiconductor element has a large area, the die bonding is performed in a short time while observing the element characteristics, whereby deformation of the semiconductor element and deterioration of the element characteristics are prevented even when the semiconductor element is subjected to a high temperature for a long time during the die bonding, resulting in high precision positioning of the semiconductor element.

According to a tenth aspect of the present invention, in a method for die bonding a semiconductor element to a submount, an aperture is provided at an upper surface electrode of the semiconductor element, a soldering material is placed on the submount and the semiconductor element is placed on the soldering material, laser light of a wavelength traveling through the semiconductor element irradiates the element from above the aperture of the upper surface electrode toward the soldering material, and a rear surface electrode of the semiconductor element is irradiated with laser light traveling through the semiconductor element, whereby the soldering material is heated and melted, and the semiconductor element is bonded to the submount. Therefore, even when a submount transmitting no laser light is employed as the submount, the die bonding is performed in a short time while observing the element characteristics, whereby deformation of the semiconductor element and deterioration of the element characteristics are prevented even when the semiconductor element is subjected to a high temperature for a long time during the bonding, resulting in high precision positioning of the semiconductor element.

According to an eleventh aspect of the present invention, in the method for die bonding a semiconductor element, a Si series optical semiconductor element is employed as the semiconductor element, laser light of a wavelength of 1 μm or above is employed as the above-described laser light irradiating the Si series optical semiconductor element.

According to a twelfth aspect of the present invention, in the method for die bonding a semiconductor element, a GaAs series optical semiconductor element is employed as the semiconductor element, and laser light of a wavelength 0.88 μm or above is employed as the laser light irradiating the GaAs series optical semiconductor element.

According to a thirteenth aspect of the present invention, in the method for die bonding a semiconductor element, an InP series optical semiconductor element is employed as the semiconductor element, and laser light of a wavelength 0.9 μm or above is employed as the laser light irradiating the InP series optical semiconductor element.

DETAILED DESCRIPTION OF THE PREFERRED EMBODIMENTS

Embodiment 1

A description will be given of a first embodiment of the present invention with reference to the drawings.

Figure 1:
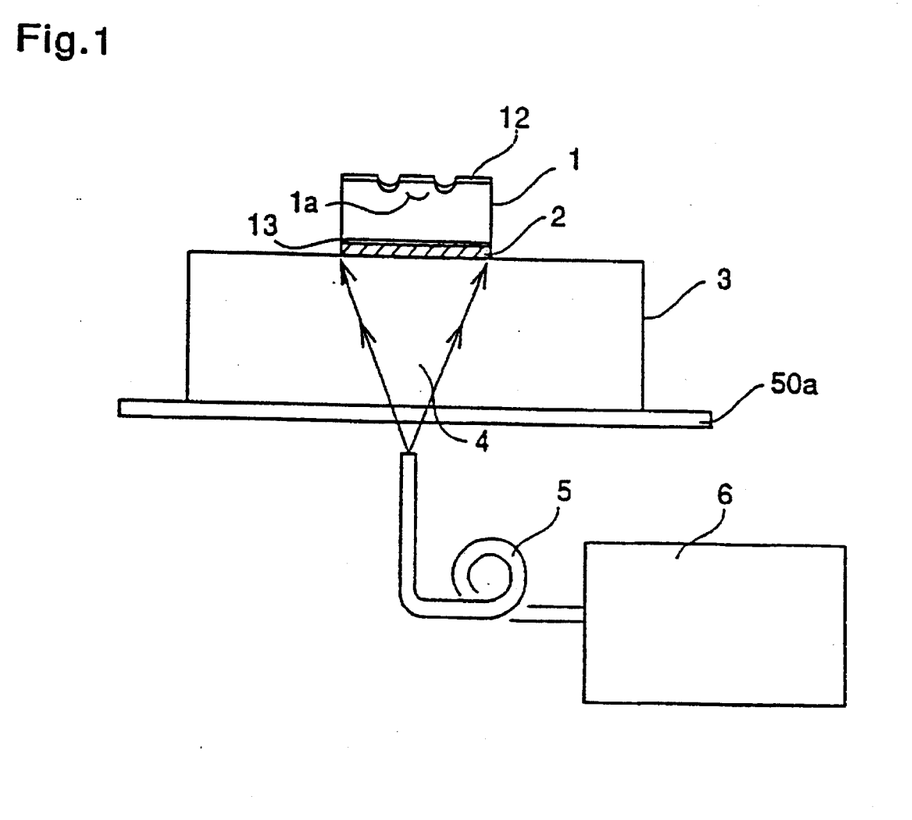
FIG. 1 is a schematic diagram illustrating an apparatus and a method for die bonding a semiconductor element in accordance with a first embodiment of the present invention.

FIG. 1 is a schematic diagram illustrating an apparatus and a method for die bonding a semiconductor element onto a submount in accordance with the first embodiment.

In FIG. 1, reference numeral 1 designates an optical semiconductor element having an area of 300×300 μm, and a thickness of approximately 100 μm. This optical semiconductor element 1 is, for example, a PBC laser having the same structure as that of the prior art device illustrated in FIG. 8(a), and this PBC laser includes an active layer 1a. An upper surface electrode 12 of the optical semiconductor element 1 comprises Au/AuGe/NiAu and has a thickness of 0.3 to 0.5 μm. A rear surface electrode 13 of the optical semiconductor element 1 comprises TiAu and has a thickness of 0.3 to 0.5 μm. A soldering material 2 comprises Au/Sn, and it has a weight ratio of Au/Sn=$^{80}/_{20}$% an area of 300×300 μm, and a thickness of 0.5 to 1 μm. Reference numeral 3 designates a Si submount having a thickness of 300 to 500 μm, and on its upper surface the optical semiconductor element 1 is mounted with the soldering material 2. A YAG laser light source 6 having an oscillation wavelength of 1.06 μm is provided to output laser light 4 of a wavelength 1.06 μm. An optical fiber 5 is provided to introduce the laser light 4 to the rear surface of the Si submount 3. Reference numeral 50a designates a sample plate made of glass, on which the optical semiconductor element 1 is placed while being die bonded onto the submount 3.

Figure 2A:
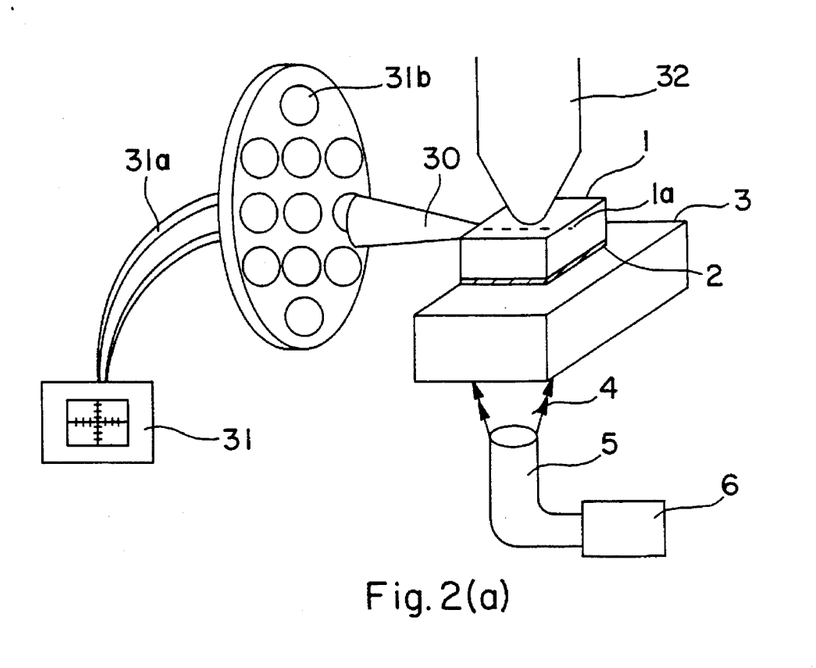
FIGS. 2(a) and 2(b) are diagrams illustrating a method for testing element characteristics during die bonding by employing the method for die bonding a semiconductor element in accordance with the first embodiment of the present invention.
Figure 2B:
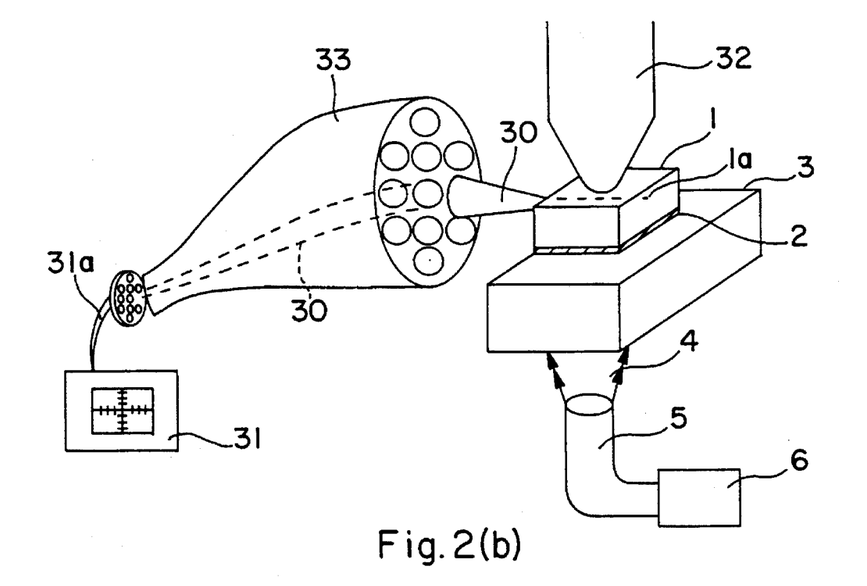

FIGS. 2(a) and 2(b) are diagrams illustrating a method for testing the element characteristics of the optical semiconductor element 1. In FIG. 2(a), a needle 32 is provided to fix the optical semiconductor element 1 on the submount 3. When the optical semiconductor element 1 is operated, it emits laser light 30. A position detector 31 includes light detecting elements 31b for detecting the laser light 30 and cables 31a for transmitting the laser light 30 from the light detecting element 31b to the position detector 31. In FIG. 2(b), an optical fiber 33 is provided to receive the laser light 30 and transmit the laser light 30 to the light detecting element 31b which is located at a distance from the optical semiconductor element 1.

Next, the operation of the die bonding apparatus and the die bonding method according to the first embodiment will be described.

First of all, as in the prior art, the soldering material 2 is placed on the Si submount 3 and the optical semiconductor element 1 is placed on the soldering material 2 while controlling the positions of the soldering material 2 and the optical semiconductor element 1 by observation of them on a television camera or the like, whereby the die bonding of the optical semiconductor element 1 is performed as illustrated in the plan view of FIG. 8(b).

Next, as shown in FIG. 1, the Si submount 3 on which the optical semiconductor element is located is placed on the glass sample plate 50a, and the laser light 4 of a wavelength 1.06 μm which is output from the YAG laser light source 6 and emitted through the optical fiber 5, irradiates the rear surface of the Si submount 3, being transmitting through the glass sample plate 50a, the laser light 4 of wavelength 1.06 μm is also transmitted through the Si submount 3 and irradiates the soldering material 2 located at the upper surface thereof.

The soldering material 2 irradiated with the laser light 4 exceeds in its temperature 280° C. in 0.5 to 1 second and is melted because of its weight ratio of Au/Sn=80/20%. This relation between weight ratio and melting temperature is shown in FIG. 10(a). Here, even when Au/Si is employed for the soldering material 2, it is heated to approximately 400° C. in a second or less and, therefore, in a case where its weight ratio is 94/6%, it is melted when it reaches 370° C. as understood from FIG. 10(b) Showing the relation between the weight ratio and the melting temperature of Au/Si.

In addition, as shown in FIG. 2(a) or FIG. 2(b), in a state where the soldering material 2 is melted, the optical semiconductor element 1 mounted on the Si submount 3 is operated by applying a voltage to it. Light emitted at a prescribed angle is deleted using the position detector 31, whereby the position determination of the optical semiconductor element 1 is performed. When the prescribed emitting angle is obtained, irradiation by the laser light 4 of the soldering material 2 is halted. Thereupon, the melted soldering material 2 is cooled and is solidified, whereby the optical semiconductor element 1 and the Si submount 3 are fixed to each other.

Here, since the optical fiber 5 used for introducing the laser light 4 to the rear surface-of the Si submount 3 has a diameter of approximately 1 mm and the laser light 4 emitted from the optical fiber 5 completely covers the area of the soldering material 2 of 300×300 µm, there is no necessity of strictly determining the position of the laser light 4 or the like, i.e., the incident angle to the Si submount 3. Further, when an optical fiber 5 having a diameter which does cover the soldering material 2 is employed, it may be possible to enlarge the emitted light 4 using a lens.

Japanese Published Patent Application No. Hei. 4-103142 discloses a glass plate package or a semiconductor device in which a semiconductor pellet is bonded to a package base placed on a glass plate by irradiating bump electrodes disposed between the package base and the semiconductor pellet with laser light from the rear surface of the glass plate, thereby heating and melting the bump electrodes to perform bonding. However, when glass that has a high dielectric constant is employed for the submount, the high frequency characteristics of the optical semiconductor element 1 mounted on the glass submount largely varies, and therefore glass is not generally employed as the submount. Thus, in the above-described first embodiment, silicon is employed as the submount.

As described above, in this first embodiment, the laser light 4 of a wavelength 1.06 µm traveling through the Si submount 3 irradiates the soldering material 2 from the rear surface side of the Si submount 3 and is transmitted therethrough, heating and melting the soldering material 2 whereby the optical semiconductor element 1 is bonded to the Si submount 3. Therefore, the die bonding is performed in a short time, with a result that deformation of the element and deterioration of the element characteristics are prevented even when the optical semiconductor element is subjected to a high temperature for a long time during die bonding. Further, it is possible to perform die bonding while observing the element characteristics.

Embodiment 2

A second embodiment of the present invention will be described with reference to the drawings.

Figure 3:
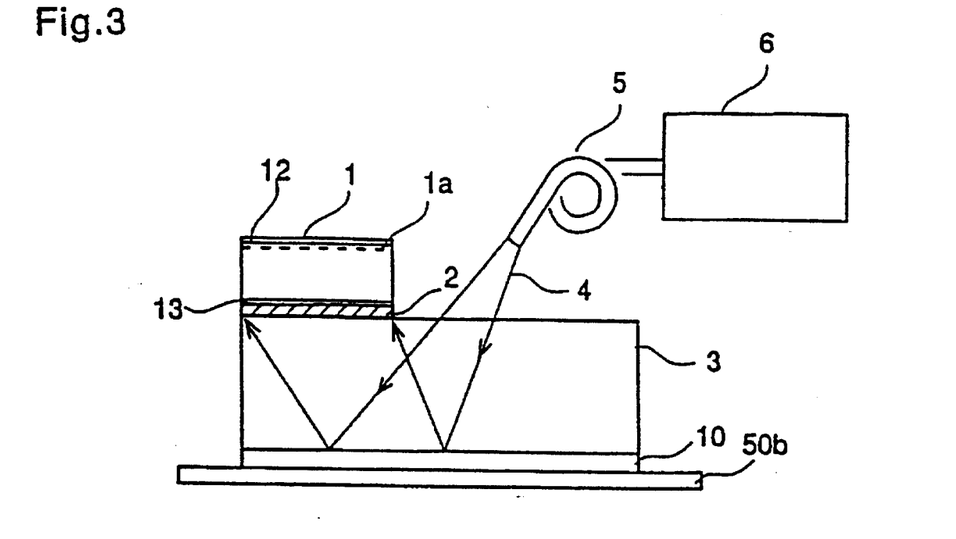
FIG. 3 is a schematic diagram illustrating an apparatus and a method for die bonding a semiconductor element in accordance with a second embodiment of the present invention.

FIG. 3 is a schematic diagram illustrating an apparatus and a method for die bonding a semiconductor element onto a submount in accordance with the second embodiment.

In FIG. 3, the same reference numerals as those shown in FIG. 1 in the first embodiment designate the same or corresponding parts. Reference numeral 50b is a sample plate on which die bonding is performed. A metal film 10 of a thickness 1 to 2 µm comprising Cr or Au is formed on a rear surface of a Si submount 3.

Next, the operation of the die bonding apparatus and die bonding method in accordance with this second embodiment will be described.

First of all, the Si submount 3 has a metal film 10 on its rear surface, and as in the first embodiment, a soldering material 2 is placed on this Si submount 3, and an optical semiconductor element 1 is placed on the soldering material 2 while controlling their positions by viewing with a television camera or the like.

Next, the Si submount 3 that has the optical semiconductor element 1 mounted on it is placed on the sample plate 50b and the laser light 4 of a wavelength 1.06 µm which is output from a YAG laser light source 6 is transmitted through the optical fiber 5 and incident on the Si submount 3 at a prescribed angle. Then, the laser light 4 having a wavelength 1.06 µm and transmitted through the Si submount 3, reaches the metal film 10 on the rear surface of the Si submount 3 and is reflected by the metal film 10, and again transmitted through the Si submount 3 and irradiates the soldering material 2 on the upper surface of the Si submount 3.

Then, as in the first embodiment, the soldering material 2 irradiated with the laser light 4 is heated and melted in 0.5 to 1 second and in this state where the soldering material 2 is melted, a voltage is applied to the optical semiconductor element 1 on the Si submount 3 to drive the optical semiconductor element 1, and the position of the optical semiconductor element 1 is determined by monitoring the emitting angle of the laser light 30 emitted from the optical semiconductor element 1 using the position detector 31. When a prescribed emitting angle of the laser light 30 is obtained, irradiation of the laser light 4 by the soldering material 2 is halted, and the soldering material 2 is cooled and solidified, whereby the optical semiconductor element 1 is bonded onto the Si submount 3.

In this second embodiment constructed as described above, even when the sample plate 50b is made of a material which transmits no laser light 4, it is possible to heat and melt the soldering material 2 with the laser light 4 of a wavelength 1.06 µm that is transmitted through the Si submount 3, whereby the optical semiconductor element 1 is bonded to the Si submount 3, with a result that deformation of the element and deterioration of the element characteristics are prevented even when the optical semiconductor element 1 is subjected to a high temperature for a long time during die bonding and the die bonding can be performed while observing the element characteristics.

In addition, the metal film 10 on the rear surface of the Si submount 3 improves handling in attaching a heat sink or the like to the rear surface of the Si submount 3 after the die bonding is performed.

Embodiment 3

A third embodiment of the present invention will be described with reference to the drawings.

Figure 4A:
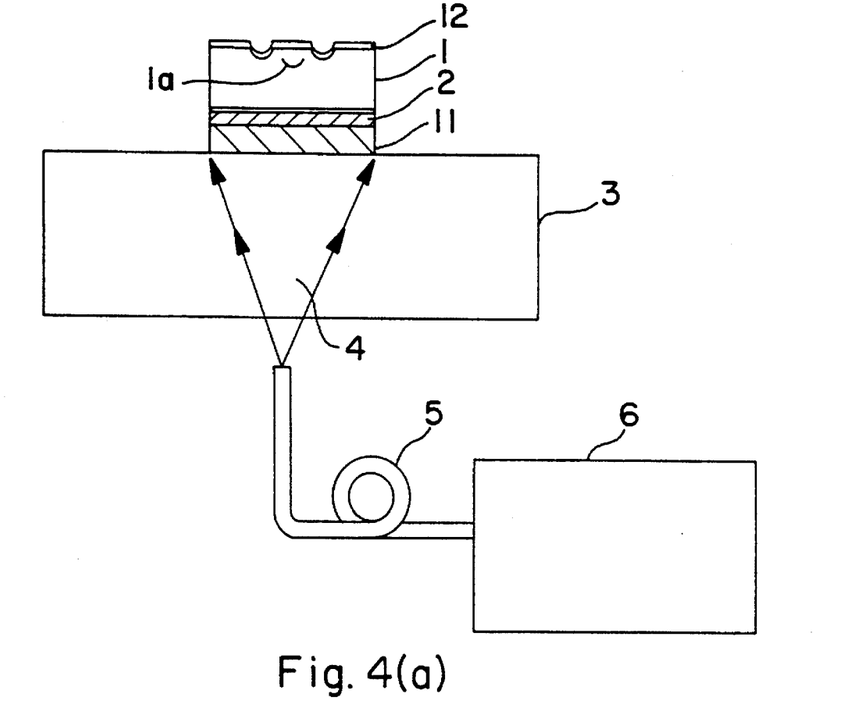
FIGS. 4(a) and 4(b) are schematic diagrams illustrating an apparatus and a method for die bonding a semiconductor element in accordance with a third embodiment of the present invention.
Figure 4B:
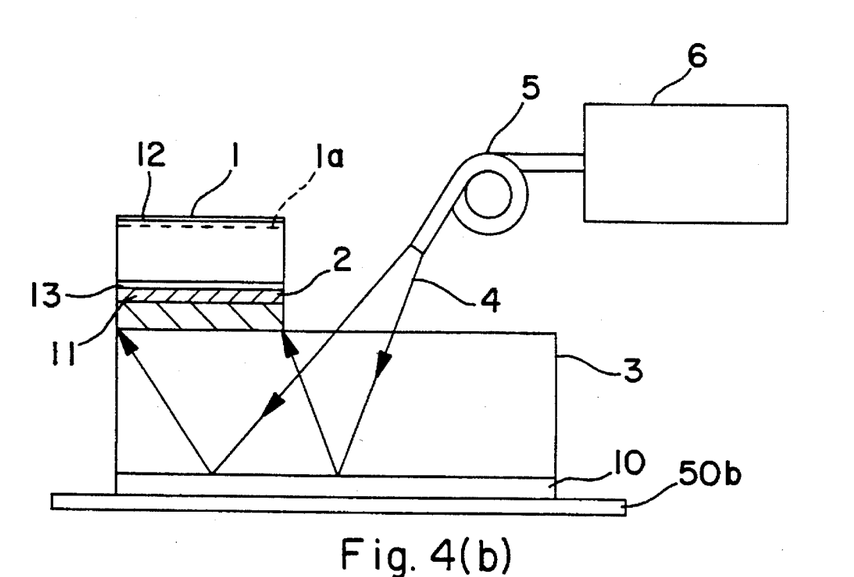

FIGS. 4(a) and 4(b) are schematic diagrams illustrating an apparatus and a method for die bonding a semiconductor element onto a submount in accordance with the third embodiment.

In FIGS. 4(a) and 4(b), the same reference numerals as those in FIG. 1 in the first embodiment or those in FIG. 2 in the second embodiment designate the same or corresponding parts. Reference numeral 11 designates an InGaAs layer which absorbs all laser light 4 at a wavelength 1.06 μm, has a thickness of approximately 0.5 μm, and has the same area as that of the optical semiconductor element 1. This InGaAs layer 11 is formed at a prescribed position on an upper surface of the Si submount 3 and has the optical semiconductor element 1 mounted on its upper surface with the soldering material 2.

Next, the operation of the die bonding apparatus and die bonding method of this third embodiment will be described.

In the first embodiment, the soldering material 2 is heated and melted by irradiation with the laser light 4 transmitted through the Si submount 3. In this third embodiment, however, the InGaAs layer 11 formed at a prescribed position on the upper surface of the Si submount 3 is heated by irradiation with the laser light 4 transmitted through the Si submount 3, whereby the soldering material 2 disposed on the InGaAs layer 11 is heated and melted.

More particularly, because the InGaAs layer 11 does not transmit light of a wavelength less than 1.63 μm and absorbs all of the laser light 4 of a wavelength 1.06 μm, as illustrated in FIG. 4(a), when the InGaAs layer 11 is irradiated by the laser light 4 transmitted through the Si submount 3, the energy of the laser light 4 is converted to heat at the InGaAs layer 11 and thus the InGaAs layer 11 is heated. The heated InGaAs layer 11 reaches in a temperature of 300° to 400° C. within one second after the irradiation with the laser light 4 is started, whereby the soldering material 2 on the InGaAs layer 11 is heated and melted.

Thereafter, as in the first and the second embodiments, the element characteristics are observed and confirmed in a state where the soldering material 2 is melted as illustrated in FIG. 2(a) or 2(b). When the tested laser light 30 has a prescribed emitting angle, irradiation by the laser light 4 of the InGaAs layer 11 is halted, so that the soldering material 2 is cooled and solidified, whereby the optical semiconductor element 1 is bonded to the Si submount 3.

Here, as a matter of course, the method of irradiating the InGaAs layer 11 may be the same as that of the second embodiment as illustrated in FIG. 4(b), and an InGaAsP layer having an energy band gap corresponding to a wavelength of approximately 1.3 to 1.5 μm may be employed in place of the InGaAs layer 11.

Also in this third embodiment constructed as described above, the soldering-material 2 is heated and melted in a short time and thereby the optical semiconductor element 1 is bonded to the Si submount 3, with the same result that deformation of the element and deterioration of the element characteristics are prevented even when the optical semiconductor element 1 is exposed to a high temperature for a long time during die bonding and that the die bonding can be performed while observing the element characteristics.

Embodiment 4

A fourth embodiment of the present invention will be described with reference to the drawings.

Figure 5A:
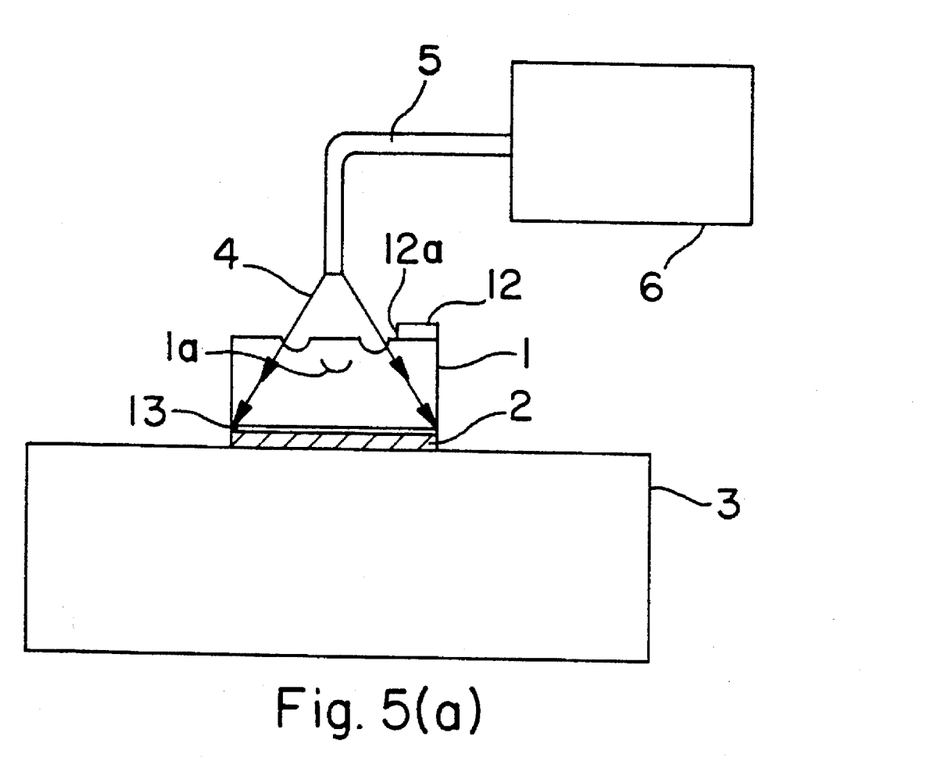
FIGS. 5(a) and 5(b) are schematic diagrams illustrating an apparatus and a method for die bonding a semiconductor element in accordance with a fourth embodiment of the present invention.
Figure 5B:
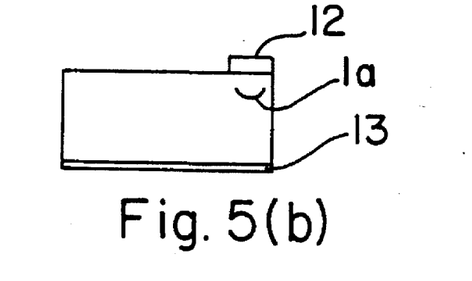

FIGS. 5(a) and 5(b) are schematic diagrams illustrating an apparatus and a method for die bonding a semiconductor element in accordance with a fourth embodiment of the present invention.

In FIGS. 5(a) and 5(b), the same reference numerals as those in FIG. 1 in the first embodiment designate the same or corresponding parts. Reference numeral 12a designates an aperture in an upper surface electrode 12. The aperture 12a has a width of 200 to 250 μm produced by forming the upper surface electrode 12 on a part of the upper surface of the optical semiconductor element 1 so as to have a width of 50 to 100 μm for wire bonding.

Next, the operation of the die bonding apparatus and method of this fourth embodiment will be described.

In each of the first to the third embodiments, the laser light 4 having a wavelength 1.06 μm is transmitted through the Si submount 3 and irradiates the soldering material 2 or the InGaAs layer 11. In this fourth embodiment, however, the laser light 4 is radiated from above the optical semiconductor element 1 toward the optical semiconductor element 1, transmitted through the optical semiconductor element 1, and irradiates the rear surface electrode 13 of the optical semiconductor element 1.

More specifically, as illustrated in FIG. 5(a), the upper surface electrode 12 of the optical semiconductor element 1 is located at a corner of the optical semiconductor element 1 so as to have a width of 50 to 100 μm.

Thereafter, the laser light 4 is radiated from above the upper surface side of the optical semiconductor element 1 toward the optical semiconductor element 1. When this optical semiconductor element 1 is a PBC laser as illustrated in FIG. 8(a), since the laser light 4 has a wavelength of 1.06 μm, it is transmitted through the $SiO_2$ layer 104 to the p type InP substrate 101 of the PBC laser (optical semiconductor element 1 in FIG. 5(a)) and irradiates the p type electrode 106 (rear surface electrode 13 in FIG. 5(a)) on the rear surface of the substrate 101.

Here, a brief description is given of the relation between the material of the optical semiconductor element 1 and the wavelength of the laser light 4 transmitted through the optical semiconductor element 1. An optical semiconductor element 1 comprising Si transmits laser light 4 of a wavelength 1.06 μm or above, an optical semiconductor element 1 comprising GaAs transmits laser light 4 of a wavelength 0.88 μm or above. An optical semiconductor element 1 comprising InP transmits laser light 4 of a wavelength 0.9 μm or above.

Since the rear surface electrode 13 of the optical semiconductor element 1 comprises TiAu, it does not transmit the laser light 4 incident thereon, and thereby it is heated. The heat of the rear surface electrode 13 propagates to the soldering material 2 between the rear surface electrode 13 and the Si submount 3, thereby melting the soldering material 2.

Thereafter, as in the first to the third embodiments, the element characteristics are observed when the soldering material 2 is melted as shown in FIG. 2(a) or 2(b), and when the tested laser light 30 reaches a state having a prescribed emitting angle, irradiation of the soldering material 2 or the InGaAs layer 11 is halted, so that the heated soldering material 2 is cooled and solidified, whereby the optical semiconductor element 1 is bonded to the Si submount 3.

Here, when the rear surface electrode 13 comprising TiAu has a weight ratio of Au/Ti=80/20%, it is not melted until it is raised to a temperature of 800° C. or above, and as for the soldering material 2, when it comprises AuSn, it is melted at 280° C. and when it comprises AuSi, it is melted at 370° C. Because the soldering material 2 is thus melted earlier than the rear surface electrode 13, the bonding can be performed without damaging the rear surface electrode 13.

While in the description of this fourth embodiment, the laser light 4 also is transmitted through the active layer 1a of the semiconductor element 1 as illustrated in FIG. 5(a), it is also possible to arrange the active layer 1a at a position directly below the upper surface electrode 12 to prevent the active layer 1a from being irradiated with the laser light 4, whereby deterioration of the active layer 1a due to transmission of the laser light 4 is avoided.

Also in this fourth embodiment constructed as described above, the soldering material 2 is heated and melted in a short time, whereby the optical semiconductor element 1 is bonded to the Si submount 3. As a result, deformation of the element and deterioration of the element characteristics are prevented even when the optical semiconductor element is subjected to a high temperature for a long time during die bonding, and the die bonding can be performed while observing the element characteristics.

Japanese Published Patent Applications 2-197373 and 2-280961 disclose methods for soldering an IC chip in which laser light irradiates an IC chip from above the IC chip which placed on a circuit board and a soldering bump. The soldering bump between an electrode pattern of the circuit substrate and the IC chip is heated and melted. However, in the method for soldering an IC chip disclosed in the Application 2-197373, the whole IC chip is heated by laser light and the soldering bump is melted by the heat of the IC chip. In the method disclosed in the Application 2-280961, a part of the IC chip where the soldering bump is located is partially heated by the laser light and the soldering bump is melted by the heat of the part of the IC chip. Accordingly, the methods disclosed in these Applications are different from the apparatus and method for die bonding a semiconductor element according to the fourth embodiment of the present invention, in which the laser light 4 incident on the upper surface of the optical semiconductor element 1 is transmitted through the semiconductor element 1 to reaching the rear surface of the semiconductor element 1, and the laser light 4 heats the rear surface electrode 13 of the optical semiconductor element 1, whereby the soldering material 2 in contact with the rear surface electrode 13 is melted by heat of the rear surface electrode 13.

Embodiment 5

A fifth embodiment of the present invention will be described with reference to the drawings.

Figure 6A:
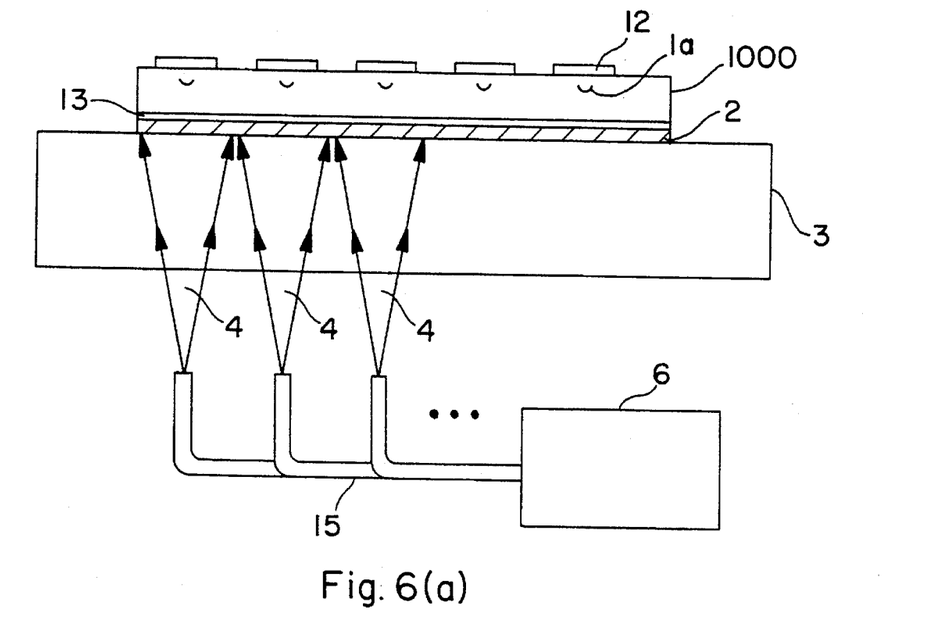
FIGS. 6(a) and 6(b) are schematic diagrams illustrating apparatus and methods for die bonding a semiconductor element in accordance with fifth and sixth embodiments of the present invention.

FIG. 6(a) is a schematic diagram illustrating an apparatus and a method for die bonding a semiconductor element in accordance with this fifth embodiment.

In FIG. 6(a), the same reference numerals as those in FIG. 1 of the first embodiment designate the same or corresponding parts. An optical fiber array 15 having a plurality of output ends is provided to divide the laser light 4 which is output by a YAG laser light source 6 into a plurality of light beams. A bar-shaped laser array 1000 is a laser array having a plurality of active layers 1a.

While in each of the first to the fourth embodiments, the optical semiconductor element 1 bonded to the Si submount 3 has one active layer 1a, in a case where the laser array 1000 having a plurality of active layers 1a is bonded to the Si submount 3 as illustrated in FIG. 6(a) in this fifth embodiment, the laser light 4 is preferably radiated from below the rear surface of the Si submount 3 and irradiates to the submount 3 after being transmitted therethrough.

In this fifth embodiment, the laser light 4 of a wavelength 1.06 μm which is output from the YAG laser light source 6 is divided into a plurality of light beams by the optical fiber array 15, and those light beams are simultaneously output from the respective output ends of the optical fiber array 15. When the light beams are transmitted through the Si submount 3 and reach the soldering material 2 arranged on the Si submount 3, they irradiate the whole lower surface of the soldering material 2. Thereupon, the soldering material 2 irradiated with the laser light 4 is raised in temperature, finally reaching its melting point and is melted.

Next, as in the first embodiment, the position of the laser array 1000 is determined in a state where the soldering material 2 is melted. When the laser array 1000 is located at a prescribed position, the radiation of the laser light 4 is halted thereby solidifying the soldering material 2, whereby the laser array 1000 is bonded to the Si submount 3.

Alternatively, means for producing the laser light 4 irradiating the Si submount 3 may be provided in plurality, each comprising the YAG laser light source 6 and an optical fiber 5.

In this fifth embodiment, even when the optical semiconductor element 1 to be bonded to the Si submount 3 has an area approximately equal to that of the bar-shaped laser array 1000, the soldering material 2 is heated and melted in a short time, whereby the laser array 1000 is easily bonded to the Si submount 3, with the result that deformation of the element and deterioration of the element characteristics are prevented even when the Si laser array 1000 is exposed to a high temperature for a long time during die bonding.

Embodiment 6

A sixth embodiment of the present invention will be described with reference to the drawings.

Figure 6B:
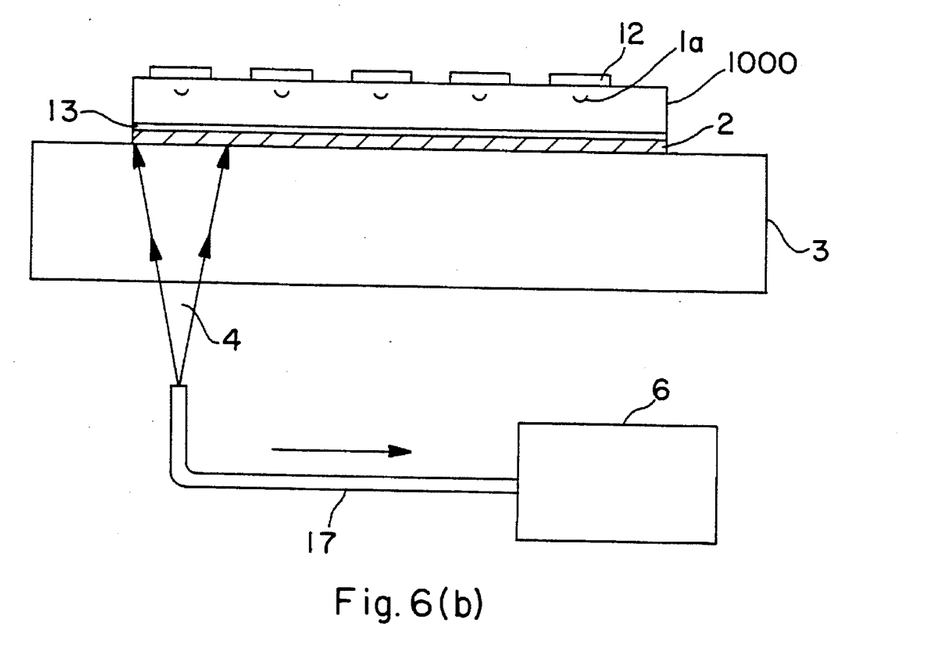

FIG. 6(b) is a schematic diagram illustrating an apparatus and a method for die bonding a semiconductor element in accordance with this sixth embodiment.

In FIG. 6(b), the same reference numerals as those in FIG. 1 in the first embodiment designate the same or corresponding parts. Reference numeral 17 designates a movable optical fiber which is capable of moving its output end freely and irradiating with laser light 4, which is output from the YAG laser light source 6, a desired part of a Si submount 3. Numeral 1000 designates a bar-shaped laser array having a plurality of active layers 1a. In this sixth embodiment, the laser light 4 which travels through the Si submount 3 and irradiates the rear surface of the Si submount 3 over the whole surface of the soldering material 2 by quickly moving and scanning the laser light 4 with the movable optical fiber 17, whereby the laser array 1000 is easily bonded to the Si submount 3, with a result that deformation of the element and deterioration of the element characteristics are prevented even when the optical semiconductor element is exposed to a high temperature for a long time during die bonding.

Alternatively, in place of employing the movable optical fiber 17, the whole lower surface of the soldering material 2 may be scanned by laser light employing an optical fiber capable of freely changing its light emitting angle, resulting in the same effect.

In addition, while in each of the first to the sixth embodiments, the method for die bonding an optical semiconductor element to a Si submount 3 is described, as a matter of course, the apparatus and the method for die bonding according to the present invention may be applied to cases where semiconductor elements other than an optical semiconductor element are bonded to submounts other than silicon.

What is claimed is:

1. A method for die bonding a semiconductor element to a submount comprising:

forming a metal film on a rear surface of a submount, placing a soldering material on a front surface of said submount, and placing said semiconductor element on said soldering material; and obliquely irradiating part of the front surface of said submount with laser light of a wavelength transmitted through said submount and reflected from said metal film, thereby irradiating, heating, and melting said soldering material with the laser light reflected from the rear surface of said submount to bond said semiconductor element to said submount.

2. The method for die bonding a semiconductor element of claim 1, wherein said submount is silicon and including irradiating said submount with laser light having a wavelength of at least 1 μm.

3. The method for die bonding a semiconductor element of claim 1, wherein said submount is silicon including:

irradiating said submount with laser light having a wavelength of 1 to 1.6 μm; and forming said soldering material by depositing an InGaAs layer on an upper surface of said Si submount, placing said soldering material on said InGaAs layer, and placing said semiconductor element on said soldering material wherein said soldering material is heated and melted by absorption of the laser light by said InGaAs layer.

4. A method for die bonding a semiconductor element to a submount comprising:

providing an aperture in an upper surface electrode of a GaAs optical element;

placing a soldering material on a submount and placing said GaAs optical element on said soldering material; and irradiating said GaAs optical element with laser light having a wavelength of at least 0.88 microns and directed toward the aperture in the upper surface electrode of said GaAs optical element and toward said soldering material, thereby heating a rear surface electrode of said GaAs optical element with the laser light transmitted through said GaAs optical element, heating and melting said soldering material, and bonding said GaAs optical element to said submount.

5. A method for die bonding a semiconductor element to a submount comprising:

providing an aperture in an upper surface electrode of a InP optical element;

placing a soldering material on a submount and placing said InP optical element on said soldering material; and irradiating said InP optical element with laser light having a wavelength of at least 0.9 microns and directed toward the aperture in the upper surface electrode of said InP optical element and toward said soldering material, thereby heating a rear surface electrode of said InP optical element with the laser light transmitted through said InP optical element, heating and melting said soldering material, and bonding said InP optical element to said submount.

* * * * *